US007998788B2

(12) United States Patent
Guha et al.

(10) Patent No.: US 7,998,788 B2
(45) Date of Patent: Aug. 16, 2011

(54) TECHNIQUES FOR USE OF NANOTECHNOLOGY IN PHOTOVOLTAICS

(75) Inventors: Supratik Guha, Chappaqua, NY (US); Hendrik F. Hamann, Yorktown Heights, NY (US); Emanuel Tutuc, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 868 days.

(21) Appl. No.: 11/494,195

(22) Filed: Jul. 27, 2006

(65) Prior Publication Data

US 2011/0165724 A1    Jul. 7, 2011

(51) Int. Cl.
*H01L 51/40* (2006.01)

(52) U.S. Cl. ........... 438/99; 438/56; 438/64; 438/82; 438/257; 438/427; 257/12; 257/40; 257/E25.009; 257/E27.051; 257/E27.073; 977/743; 977/938

(58) Field of Classification Search ........ 977/700–838, 977/938, 948, 954, 936; 427/74, 248.1, 255.38, 427/255.7, 301; 438/1–10, 56, 64, 99, 82, 438/257, 427; 136/243–265; 257/14, 19, 257/20, 40, E25.009, E25.002, E27.051, 257/E27.073

See application file for complete search history.

(56) References Cited

U.S. PATENT DOCUMENTS

| | | | |
|---|---|---|---|
| 6,649,824 B1 | 11/2003 | Den et al. | |
| 7,166,528 B2 * | 1/2007 | Kim et al. | 438/607 |
| 2003/0029495 A1 | 2/2003 | Mazur et al. | |
| 2004/0157354 A1 * | 8/2004 | Kuriyama et al. | 438/45 |
| 2004/0250950 A1 | 12/2004 | Dubrow | |
| 2005/0009224 A1 | 1/2005 | Yang et al. | |
| 2005/0214967 A1 | 9/2005 | Scher et al. | |
| 2005/0224790 A1 * | 10/2005 | Jin et al. | 257/43 |
| 2006/0019472 A1 * | 1/2006 | Pan et al. | 438/486 |
| 2006/0086314 A1 | 4/2006 | Zhang et al. | |
| 2006/0175601 A1 * | 8/2006 | Lieber et al. | 257/19 |
| 2006/0207647 A1 * | 9/2006 | Tsakalakos et al. | 136/256 |
| 2007/0111368 A1 * | 5/2007 | Zhang et al. | 438/99 |
| 2007/0111503 A1 * | 5/2007 | Jeon et al. | 438/618 |
| 2008/0010707 A1 * | 1/2008 | Zhang et al. | 977/762 |

(Continued)

OTHER PUBLICATIONS

Keyes et al., Comparison of the Device Physics Principles of Planar and Radial p-n Junction Nanorod Solar Cells, 97 J. Appl. Phys. 114302 (2005).

(Continued)

*Primary Examiner* — Khiem D Nguyen
*Assistant Examiner* — Su C Kim
(74) *Attorney, Agent, or Firm* — Vazken Alexanian; Michael J. Chang, LLC

(57) ABSTRACT

Techniques for combining nanotechnology with photovoltaics are provided. In one aspect, a method of forming a photovoltaic device is provided comprising the following steps. A plurality of nanowires are formed on a substrate, wherein the plurality of nanowires attached to the substrate comprises a nanowire forest. In the presence of a first doping agent and a first volatile precursor, a first doped semiconductor layer is conformally deposited over the nanowire forest. In the presence of a second doping agent and a second volatile precursor, a second doped semiconductor layer is conformally deposited over the first doped layer. The first doping agent comprises one of an n-type doping agent and a p-type doping agent and the second doping agent comprises a different one of the n-type doping agent and the p-type doping agent from the first doping agent. A transparent electrode layer is deposited over the second doped semiconductor layer.

17 Claims, 5 Drawing Sheets

U.S. PATENT DOCUMENTS

2008/0210122 A1* 9/2008 Magdassi et al. .......... 106/31.05
2008/0224122 A1* 9/2008 Saitoh et al. .................... 257/14

OTHER PUBLICATIONS

H.C. Card et al., Electronic Processes At Grain Boundaries in Polycrystalline Semiconductors Under Optical Illumination, IEEE Trans. Electron Devices ED-24, 397-402 (1977).

H. Kaplan, Black Coatings Are Critical in Optical Design, 31 Photon. Spectra 48-50 (1997).

C. Amra, From Light Scattering to the Microstructure of Thin Film Multilayers, 32 Appl. Opt. 5451-5491 (1993).

H. Kaplan, Gold Rules the World of Infrared, 31 Photon. Spectra 54-56 (1997).

* cited by examiner

100

200

300

US 7,998,788 B2

TECHNIQUES FOR USE OF NANOTECHNOLOGY IN PHOTOVOLTAICS

STATEMENT OF GOVERNMENT RIGHTS

This invention was made with Government support under N66001-05-C-8043 awarded by Defense Advanced Research Projects Agency (DARPA). The Government has certain rights in this invention.

FIELD OF THE INVENTION

The present invention relates to use of nanotechnology in photovoltaics, and more particularly, to nanostructure-based photovoltaic devices.

BACKGROUND OF THE INVENTION

Photovoltaic devices, such as photocells, are an important energy source that has thus far remained underutilized for widespread energy production due to undesirable efficiency and/or production cost factors. For example, conventional photocells comprise a silicon-based substrate that includes a large-area p-n junction. Crystalline semiconductor substrates, such as silicon, are expensive, making production of photocells cost prohibitive for many applications. Further, photocells generate electrical energy by converting photons from a light source into electricity (e.g., by freeing electron-hole pairs). Conventional photocells typically provide a light-to-electricity conversion efficiency of only up to about 25%. This low conversion efficiency similarly makes photocells an undesirable option for many applications.

Attempts have been made to increase photocell energy conversion efficiency. Some of the attempts have employed nanotechnology as a tool. See, for example, U.S. Patent Application No. 2005/0009224 filed by Yang et al., entitled "Nanowire Array and Nanowire Solar Cells and Methods for Forming the Same" (wherein nanowire oxides are used in conjunction with a charge transport medium in optoelectronic devices); U.S. Patent Application No. 2005/0214967 filed by Scher et al., entitled "Nanostructure and Nanocomposite Based Compositions and Photovoltaic Devices" (wherein nanostructures, such as core-shell nanocrystals, are used in photovoltaic devices oriented horizontally along the plane of the electrodes); and Kayes et al., *Comparison of the Device Physics Principles of Planar and Radial p-n Junction Nanorod Solar Cells*, 97 J. APPL. PHYS. 114302 (2005) (wherein radial p-n junction nanorod solar cells are described).

As these references show, nanotechnology can be employed in photovoltaics. However, improved techniques for combining these technologies to cost-effectively produce more efficient photovoltaic devices are needed.

SUMMARY OF THE INVENTION

The present invention provides techniques for combining nanotechnology with photovoltaics. In one aspect of the invention, a method of forming a photovoltaic device is provided comprising the following steps. A plurality of nanowires are formed on a substrate, wherein the plurality of nanowires attached to the substrate comprises a nanowire forest. In the presence of a first doping agent and a first volatile precursor, a first doped semiconductor layer is conformally deposited over at least a portion of the nanowire forest. In the presence of a second doping agent and a second volatile precursor, a second doped semiconductor layer is conformally deposited over at least a portion of the first doped layer. The first doping agent comprises one of an n-type doping agent and a p-type doping agent and the second doping agent comprises a different one of the n-type doping agent and the p-type doping agent from the first doping agent. A transparent electrode layer is deposited over at least a portion of the second doped semiconductor layer.

In another aspect of the invention, a method of forming a photovoltaic device is provided comprising the following steps. In the presence of a first doping agent and a first volatile precursor, a plurality of nanowires are formed on a substrate, wherein the plurality of nanowires attached to the substrate comprises a nanowire forest. In the presence of a second doping agent and a second volatile precursor, a doped semiconductor layer is conformally deposited over at least a portion of the nanowire forest. The first doping agent comprises one of an n-type doping agent and a p-type doping agent and the second doping agent comprises a different one of the n-type doping agent and the p-type doping agent from the first doping agent. A transparent electrode layer is deposited over at least a portion of the doped semiconductor layer.

In yet another aspect of the invention, a photovoltaic device is provided. The photovoltaic device comprises a substrate; a plurality of nanowires on the substrate, wherein the plurality of nanowires attached to the substrate comprises a nanowire forest; a first doped semiconductor layer disposed conformally over at least a portion of the nanowire forest, the first doped semiconductor layer comprising a first doping agent; a second doped semiconductor layer disposed conformally over at least a portion of the first doped semiconductor layer, the second doped semiconductor layer comprising a second doping agent, wherein the first doping agent comprises one of an n-type doping agent and a p-type doping agent and the second doping agent comprises a different one of the n-type doping agent and the p-type doping agent from the first doping agent; and a transparent electrode layer disposed over at least a portion of the second doped semiconductor layer.

In still another aspect of the invention, a photovoltaic device is provided. The photovoltaic device comprises a substrate; a plurality of nanowires on the substrate, the nanowires comprising a first doping agent and wherein the plurality of nanowires attached to the substrate comprises a nanowire forest; a doped semiconductor layer disposed conformally over at least a portion of the nanowire forest, the doped semiconductor layer comprising a second doping agent, wherein the first doping agent comprises one of an n-type doping agent and a p-type doping agent and the second doping agent comprises a different one of the n-type doping agent and the p-type doping agent from the first doping agent; and a transparent electrode layer disposed over at least a portion of the doped semiconductor layer.

A more complete understanding of the present invention, as well as further features and advantages of the present invention, will be obtained by reference to the following detailed description and drawings.

DETAILED DESCRIPTION OF PREFERRED EMBODIMENTS

Figure 1:
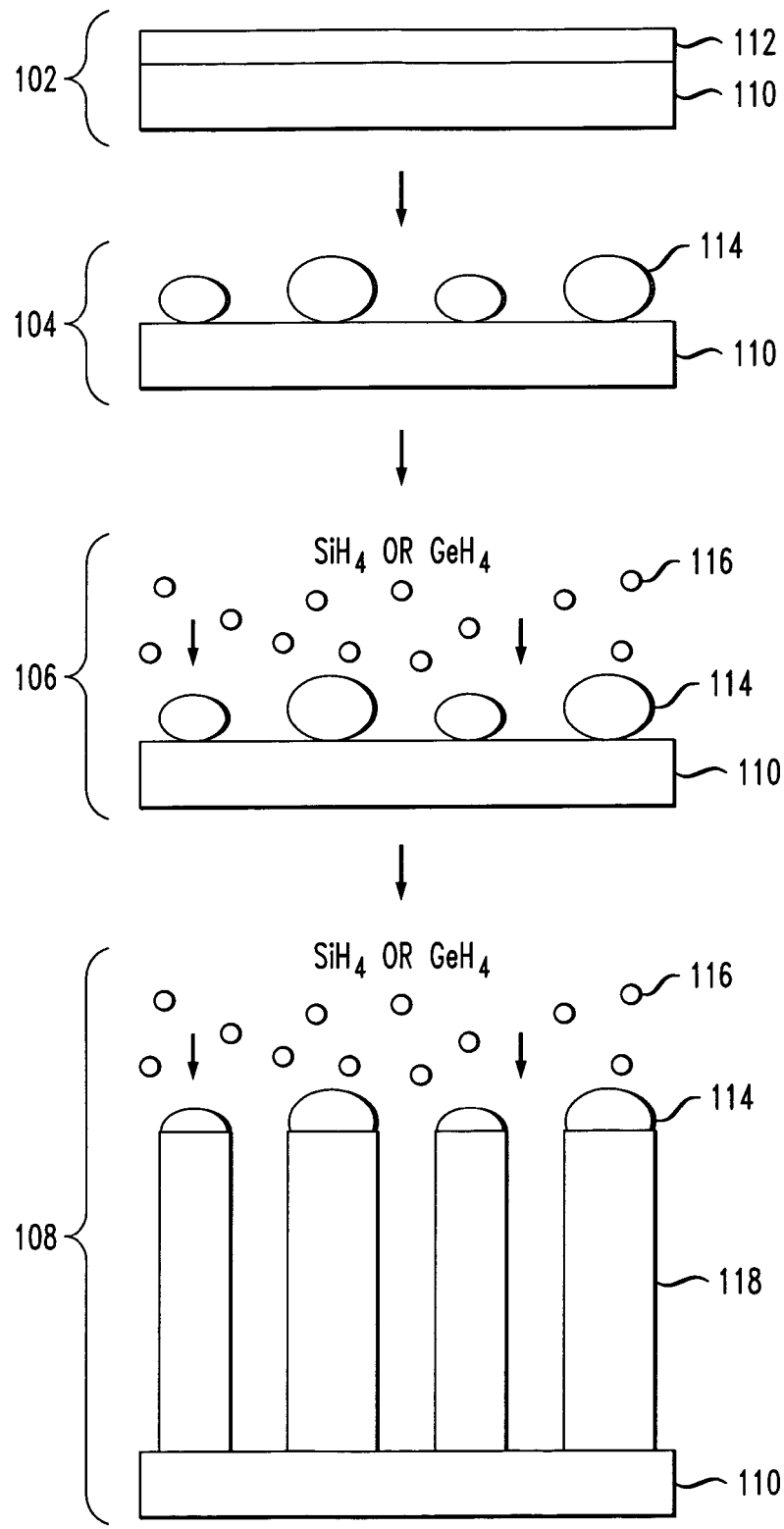
FIG. 1 is a diagram illustrating an exemplary methodology for growing a nanowire forest according to an embodiment of the present invention.

FIG. 1 is a diagram illustrating exemplary methodology 100 for growing a nanowire forest. The term "nanowire forest," as used herein, refers to a plurality of nanowires attached to a substrate. As will be described in detail below, the growth of the nanowire forest is conducted in a chemical vapor environment.

Nanowires are highly-anisotropic, rod-like crystals with diameters d of between about ten nanometers (nm) and about 70 nm and lengths L of between about 0.1 micrometers ($\mu$m) and about 100 $\mu$m. Due to the nanowires having large L to d ratios, the surface area of the substrate is increased by a factor (4L/d)f wherein f denotes the fraction of the substrate area covered by nanowires. By way of example only, for a five percent substrate areal coverage, nanowires of diameter d=40 nm and length L=five $\mu$m will provide a surface area that is 25 times greater than that of the substrate alone.

While the present description is directed to nanowires being a preferred nanostructure for use herein, any other suitable nanostructures may be similarly employed. Other suitable nanostructures include, but are not limited to, nanoparticles, quantum dots and other nanoscale materials.

In step 102 of FIG. 1, at least a portion of substrate 110 is coated with a catalyst metal to form catalyst layer (film) 112. Catalyst layer 112 can be deposited on substrate 110 using chemical vapor deposition (CVD) techniques.

Substrate 110 can comprise any suitable substrate material, including, but not limited to, one or more of glass, quartz and a semiconductor material, such as silicon (Si) or germanium (Ge). Optionally, when substrate 110 comprises a semiconductor material, substrate 110 can be doped with either an n-type or a p-type doping agent, so as to be conductive. Suitable doping agents include, but are not limited to, diborane ($B_2H_6$) (a p-type doping agent) and phosphine ($PH_3$) (an n-type doping agent). According to an exemplary embodiment, substrate 110 comprises Si and is doped with an n-type doping agent.

Catalyst layer 112 deposited onto substrate 110, can comprise any suitable catalyst metal, including, but not limited to, one or more of gold (Au), gallium (Ga) and indium (In). According to one exemplary embodiment, catalyst layer 112 comprises Au and is deposited on substrate 110 to a thickness of up to about ten Angstroms (Å).

In step 104, substrate 110 is annealed to cause catalyst layer 112 to form small droplets 114. According to an exemplary embodiment, substrate 110 is annealed at a temperature of between about 400 degrees Celsius (° C.) and about 500° C. to form droplets 114 having diameters of between about ten nm and about 30 nm. Further, as shown in FIG. 1, droplets 114 of varying diameters are typically formed by the annealing process.

In step 106, substrate 110 is exposed to an ambient of one or more volatile precursors 116. Suitable precursors include, but are not limited to, one or more of silane ($SiH_4$) and germane ($GeH_4$). The specific precursor used will dictate the nanowire composition. For example, if $SiH_4$ is employed as the precursor, then Si nanowire growth (as described in step 108, below) will result. Similarly, if $GeH_4$ is employed as the precursor, then Ge nanowire growth (as described in step 108, below) will result. A combination of $SiH_4$ and $GeH_4$ will result in SiGe nanowire growth, wherein the relative concentration of Si and Ge will depend on the ratio of partial pressures of $SiH_4$ and $GeH_4$ in the growth ambient, as well as, on the growth temperature. Suitable partial pressures of the precursor(s) and temperature parameters are provided below.

By way of example only, suitable growth conditions for Si nanowires include a temperature of between about 400° C. and about 500° C. and a partial pressure of the precursor of between about 0.1 torr and about 100 torr. Suitable growth conditions for Ge nanowires include a temperature of between about 250° C. and about 300° C. and a partial pressure of the precursor of between about 0.1 torr and about 100 torr.

Optionally, an n-type and/or a p-type doping agent may be introduced to the ambient during nanowire growth. For example, some embodiments, described below, include n-type and/or p-type doped nanowires. Suitable doping agents include, but are not limited to, $B_2H_6$ and $PH_3$. By way of example only, if substrate 110 is exposed to an ambient of $GeH_4$ and $B_2H_6$, boron-doped (B-doped), p-type Ge nanowire growth will result. Similarly, if substrate 110 is exposed to an ambient of $GeH_4$ and $PH_3$, phosphorous-doped (P-doped), n-type Ge nanowire growth will result.

In step 108, droplets 114 will mediate CVD growth of crystals, namely nanowires 118. According to an exemplary embodiment, when droplets 114 comprise Au as the catalyst metal, and the growth conditions outlined above are employed, highly anisotropic Si or Ge nanowires are produced.

The diameters of the nanowires produced are determined by the diameters (i.e., sizes) of the respective droplets 114. The lengths of the nanowires produced are determined by the growth time and growth pressure. For example, at a partial pressure of $GeH_4$ in the CVD reactor of 0.5 torr and a temperature of 285° C., the longitudinal growth rate for Ge nanowires is about five $\mu$m/hour. At constant temperature, e.g., 285° C., the nanowire growth rate depends linearly on the partial pressure of $GeH_4$ in the growth ambient. At constant pressure, the growth rate depends exponentially on the temperature (i.e., in a limited temperature window, because at higher temperatures the nanowire growth can be complicated by conformal growth).

As described above, the nanowires produced can have diameters of between about ten nm and about 70 nm and lengths of between about 0.1 $\mu$m and about 100 $\mu$m. For example, the nanowires produced can have diameters of between about 20 nm and about 50 nm and lengths of between about one $\mu$m and about ten $\mu$m.

Figure 2:
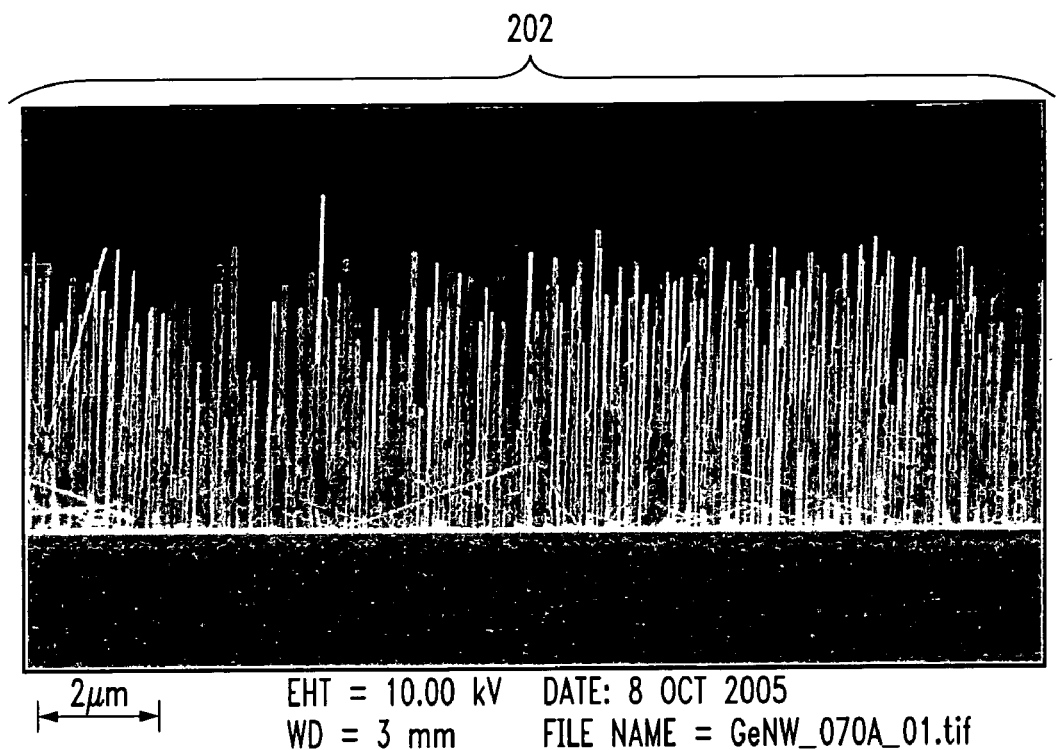
FIG. 2 is a scanning electron micrograph image of an exemplary nanowire forest according to an embodiment of the present invention.

FIG. 2 is scanning electron micrograph image 200 of exemplary nanowire forest 202, e.g., produced according to methodology 100, described in conjunction with the description of FIG. 1, above. Nanowire forest 202 comprises Ge nanowires grown predominately in a vertical direction. The substrate employed is an n-type doped Si wafer.

As will be described in detail below, the nanowire forests possess a very high absorption coefficient of incident, visible electromagnetic waves (light). According to the present techniques, these high light-absorptive properties can be utilized by incorporating the nanowire forests into photovoltaic devices, such as photocells, to convert light into electricity with enhanced efficiency and to reduce the overall size of the devices to minimize use of costly production materials.

Figure 3:
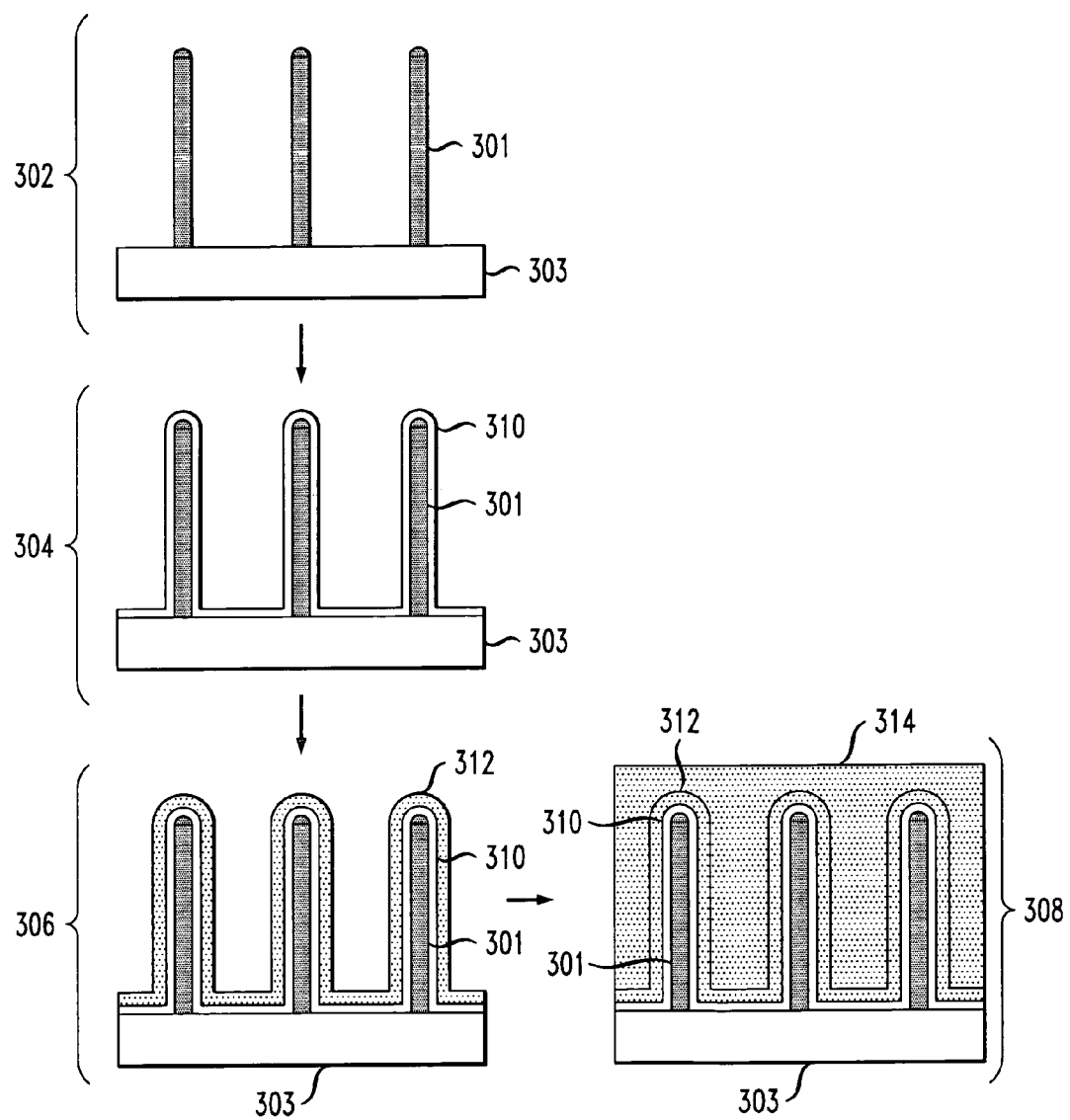
FIG. 3 is a diagram illustrating an exemplary methodology for forming a photovoltaic device according to an embodiment of the present invention.

FIG. 3 is a diagram illustrating exemplary methodology 300 for forming a photovoltaic device. As will be described in detail below, the photovoltaic device is formed using CVD growth techniques.

In step 302, the starting structure for the photocell is a nanowire forest formed in accordance with exemplary methodology 100, described above, and comprises nanowires 301 on substrate 303. Substrate 303 comprises a semiconductor material doped with a doping agent, so as to be conductive. The doping of a semiconductor substrate material is described, for example, in conjunction with the description of FIG. 1, above.

According to one exemplary embodiment, substrate 303 comprises an n-type doped Si wafer and nanowires 301 comprise Ge. The use of Ge nanowires, in particular, significantly decreases reflectivity (e.g., to below $10^{-4}$ across the whole visible light spectrum), i.e., rendering the nanowire forest a black body, and thus enhances the desirable light absorptive properties of the nanowire forest.

In step 304, doped semiconductor layer 310, which may comprise either a p-type or an n-type doped layer, is formed over the nanowire forest by conformal CVD growth (so as to have the same relative shape as the underlying structure, i.e., the nanowire forest). According to one exemplary embodiment, wherein doped semiconductor layer 310 comprises a p-type doped layer, doped semiconductor layer 310 is formed by exposing the nanowire forest to an ambient of $GeH_4$ and $B_2H_6$. This results in B-doped, p-type Ge layer growth. At a temperature of about 350° C., a $GeH_4$ partial pressure of about 0.33 torr and a $B_2H_6/GeH_4$ ratio of about 0.0001, the growth rate of a p-type doped semiconductor layer 310 will be on the order of about 200 nm/hour, with a doping concentration of about $10^{18}$ $cm^{-3}$.

According to another exemplary embodiment, wherein doped semiconductor layer 310 comprises an n-type doped layer, doped semiconductor layer 310 is formed by exposing the nanowire forest to an ambient of $GeH_4$ and $PH_3$. This results in P-doped, n-type Ge layer growth. At a temperature of about 350° C., a $GeH_4$ partial pressure of about 0.33 torr and a $PH_3/GeH_4$ ratio of about 0.0001, the growth rate of an n-type doped semiconductor layer 310 will be on the order of about 210 nm/hour, with a doping concentration of about $10^{18}$ $cm^{-3}$. The growth rates and doping concentrations given can vary based on temperature and gas flow ratios, and therefore are merely exemplary.

In step 306, doped semiconductor layer 312, which may comprise either a p-type or an n-type doped layer, is formed over doped semiconductor layer 310 by conformal CVD growth. The doping of doped semiconductor layer 310 has to be different from the doping of doped semiconductor layer 312. Namely, if doped semiconductor layer 310 comprises a p-type doped layer, then doped semiconductor layer 312 must comprise an n-type doped layer. Similarly, if doped semiconductor layer 310 comprises an n-type doped layer, then doped semiconductor layer 312 must comprise a p-type doped layer.

According to one exemplary embodiment, wherein doped semiconductor layer 312 comprises a p-type doped layer, doped semiconductor layer 312 is formed by exposing the nanowire forest/doped semiconductor layer 310 structure to an ambient of $GeH_4$ and $B_2H_6$. As described above, this results in B-doped, p-type Ge layer growth. At a temperature of about 350° C., a $GeH_4$ partial pressure of about 0.33 torr and a $B_2H_6/GeH_4$ ratio of about 0.0001, the growth rate of a p-type doped semiconductor layer 312 will be on the order of about 200 nm/hour, with a doping concentration of about $10^{18}$ $cm^{-3}$.

According to another exemplary embodiment, wherein doped semiconductor layer 312 comprises an n-type doped layer, doped semiconductor layer 312 is formed by exposing the nanowire forest/doped semiconductor layer 310 structure to an ambient of $GeH_4$ and $PH_3$. As described above, this results in P-doped, n-type Ge layer growth. At a temperature of about 350° C., a $GeH_4$ partial pressure of about 0.33 torr and a $PH_3/GeH_4$ ratio of about 0.0001, the growth rate of n-type doped semiconductor layer 312 will be on the order of about 210 nm/hour, with a doping concentration of about $10^{18}$ $cm^{-3}$. The growth rate and doping concentration given can vary based on temperature and gas flow ratios, and therefore are merely exemplary.

In step 308, the nanowire forest/doped semiconductor layer 310/doped semiconductor layer 312 structure is capped with transparent electrode layer 314. Transparent electrode layer 314 may be disposed using CVD. According to an exemplary embodiment, transparent electrode layer 314 comprises indium tin oxide (ITO).

As a result of methodology 300, a p-n junction is formed over the nanowire forest. As will be described, for example, in conjunction with the description of FIG. 5, below, the resulting structure can be used as a photocell.

Figure 4:
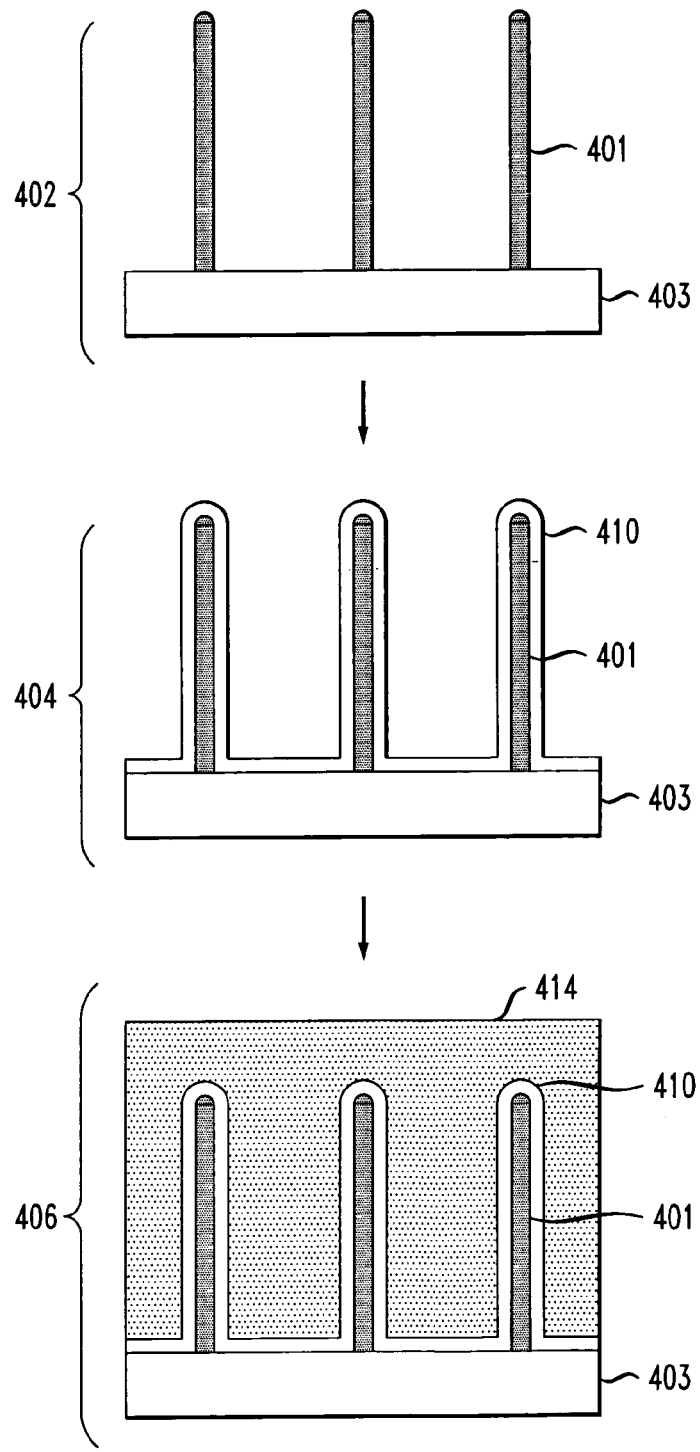
FIG. 4 is a diagram illustrating another exemplary methodology for forming a photovoltaic device according to an embodiment of the present invention.

FIG. 4 is a diagram illustrating exemplary methodology 400 for forming a photovoltaic device. As will be described in detail below, the photovoltaic device is formed using CVD growth techniques.

In step 402, the starting structure for the photovoltaic device is a nanowire forest formed in accordance with exemplary methodology 100, described above, and comprises nanowires 401 on substrate 403. Substrate 403 comprises a semiconductor material and is doped with a doping agent, so as to be conductive. The doping of a semiconductor substrate material is described, for example, in conjunction with the description of FIG. 1, above. According to one exemplary embodiment, substrate 403 comprises an n-type doped Si wafer.

Nanowires 401 are doped with either a p-type or an n-type doping agent and thus are conductive. Namely, nanowires 401 may comprise either p-type or n-type doped nanowires. According to one exemplary embodiment, nanowires 401 comprise p-type or n-type doped Ge nanowires. The doping of nanowires is described, for example, in conjunction with the description of FIG. 1, above.

In step 404, doped semiconductor layer 410, which may comprise either a p-type or an n-type doped layer, is formed over the nanowire forest by conformal CVD growth (so as to have the same relative shape as the underlying structure, i.e., the nanowire forest). The doping of doped semiconductor layer 410 has to be different from the doping of nanowires 401. Namely, if nanowires 401 comprise p-type doped nanowires, then doped semiconductor layer 410 must comprise an n-type doped layer. Similarly, if nanowires 401 comprise n-type doped nanowires, then doped semiconductor layer 410 must comprise a p-type doped layer.

According to one exemplary embodiment, wherein doped semiconductor layer 410 comprises a p-type doped layer, doped semiconductor layer 410 is formed by exposing the nanowire forest to an ambient of $GeH_4$ and $B_2H_6$. This results in B-doped, p-type Ge layer growth. At a temperature of about 350° C., a $GeH_4$ partial pressure of about 0.33 torr and a $B_2H_6/GeH_4$ ratio of about 0.0001, the growth rate of a p-type doped semiconductor layer 410 will be on the order of about 200 nm/hour, with a doping concentration of about $10^{18}$ $cm^{-3}$.

According to another exemplary embodiment, wherein doped semiconductor layer 410 comprises an n-type doped layer, doped semiconductor layer 410 is formed by exposing the nanowire forest to an ambient of $GeH_4$ and $PH_3$. This results in P-doped, n-type Ge layer growth. At a temperature of about 350° C., a $GeH_4$ partial pressure of about 0.33 torr and a $PH_3/GeH_4$ ratio of about 0.0001, the growth rate of an n-type doped semiconductor layer 410 will be on the order of about 210 nm/hour, with a doping concentration of about $10^{18}$ cm$^{-3}$. The growth rates and doping concentrations given can vary based on temperature and gas flow ratios, and therefore are merely exemplary.

In step 406, the nanowire forest/doped semiconductor layer 410 structure is capped with transparent electrode layer 414. Transparent electrode layer 414 may be disposed using CVD. According to an exemplary embodiment, transparent electrode layer 414 comprises ITO.

As a result of methodology 400, a p-n junction is formed with the doped nanowires. As will be described, for example, in conjunction with the description of FIG. 5, below, the resulting structure can be used as a photocell.

Figure 5:
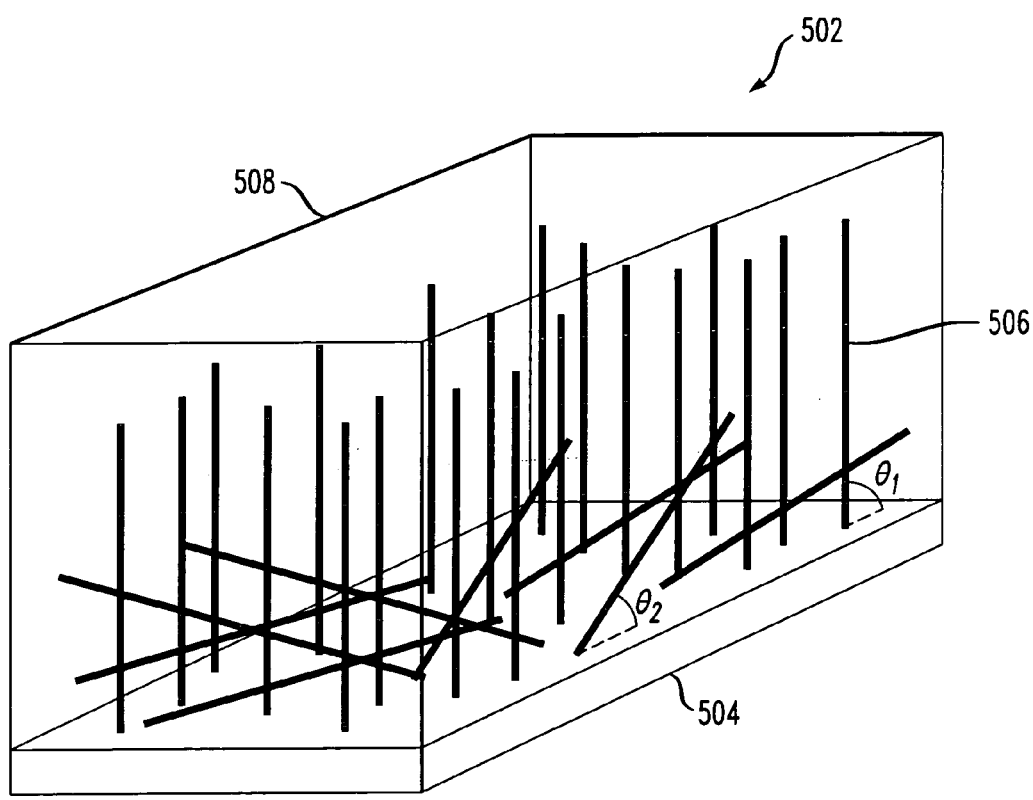
FIG. 5 is a diagram illustrating an exemplary photocell according to an embodiment of the present invention.

FIG. 5 is a diagram illustrating exemplary photocell 502. Photocell 502 comprises, e.g., n-type, doped substrate 504, nanowire-based p-n junctions 506 and transparent electrode layer 508. The use of nanowire-based p-n junctions in a photocell increases the surface area of the p-n junctions, which is beneficial in enhancing light absorption.

Further, the use of nanowire-based p-n junctions in a photocell takes advantage of the single crystal structure of a nanowire. Namely, the performance of a photocell can be degraded if the underlying material has defects. For example, grain boundaries enhance minority carrier recombination, thus reducing carrier lifetime and increasing the dark current. The grain boundaries also reduce majority carrier mobility and increase the series resistance of the photocell. See, for example, H. C. Card et al., *Electronic Processes At Grain Boundaries in Polycrystalline Semiconductors Under Optical Illumination,* IEEE TRANS. ELECTRON DEVICES ED-24, 397-402 (1977), the disclosure of which is incorporated by reference herein. As such, single crystal structures, such as nanowires, can minimize or eliminate the presence of material defects and the decrease in performance associated therewith.

Photocell 502 may be fabricated using either methodology 300 or methodology 400 described, for example, in conjunction with the description of FIGS. 3 and 4, respectively, above. Thus, for example, if photocell 502 is fabricated using methodology 300, then nanowire-based p-n junctions 506 comprise two doped semiconductor layers formed, i.e., disposed conformally, over a nanowire forest. Similarly, if photocell 502 is fabricated using methodology 400, then nanowire-based p-n junctions 506 comprise a single doped semiconductor layer formed, i.e., disposed conformally, over a doped nanowire forest.

One of the challenges in photovoltaic device, i.e., photocell, applications is to maximize solar light absorption. The design of photocell 502 incorporating a plurality of nanowire-based p-n junctions is based on the discovery that a plurality of nanowires enables very high light absorption. Specifically, the absorption spectrum of various films of Ge nanowires have been measured, and showed 99 percent absorption over most of the relevant spectral range.

Photocell 502 can be configured to optimize the absorption of incoming light. One way to achieve this is by employing an irregular configuration of nanowire-based p-n junctions 506. Such an irregular configuration is shown in FIG. 5, wherein some of nanowire-based p-n junctions 506 are oriented perpendicular to substrate 504, e.g., at an angle $\theta_1$ between about 75 degrees to about 90 degrees relative to substrate 504, and others of nanowire-based p-n junctions 506 are oriented nearly parallel to substrate 504, e.g., at an angle $\theta_2$ up to about 45 degrees relative to substrate 504.

This irregular configuration helps optimize the orientations of nanowire-based p-n junctions 506 with respect to the angles of incoming light. For example, the nanowire-based p-n junctions 506 oriented nearly parallel to substrate 504 enhance absorption by aligning with the electric field vectors of the incoming light.

An irregular nanowire configuration can be produced using either a non-crystalline substrate, or a crystalline substrate with a rough, faceted surface (i.e., a crystalline Si substrate with a rough, faceted surface). A certain degree of irregularity is typically observed due to the ubiquitous imperfections of the substrate surface. However, according to an exemplary embodiment, the substrate surface is intentionally roughened or rendered non-crystalline (for example, by ion treatment) to increase irregular nanowire growth. Preferably, the spatial wavelengths of the surface roughness are smaller than the wavelength of the absorbed light (the wavelengths of absorbed light can be, e.g., between about 400 nm and about 800 nm).

Further, while most of the enhanced light absorption is caused by "roughness" of the nanowire film (see, for example, H. Kaplan, *Black Coatings Are Critical In Optical Design,* 31 PHOTON. SPECTRA 48-50 (1997) and C. Amra, *From Light Scattering to the Microstructure of Thin Film Multilayers,* 32 APPL. OPT. 5481-5491 (1993), the disclosures of which are incorporated by reference herein) a plurality of nanowires also show altered absorption/reflection properties due to coupling between the nanowires, which is not found with individual nanowires.

These coupling modes can be further exploited for optimum light absorption. For example, the optical properties of a plurality of nanowires (or clusters of nanowires) can be governed by dipole-dipole interactions. For example, the individual nanowires can interact as "quasi-antennas" with the incident electrical field. The radiation field from these antennas will interact with other nanowires, thus altering the collective optical properties of the nanowire film. Further, the wavefunction of nanowires can overlap (couple quantum mechanically), which will alter the optical properties of nanowire films. In addition, the dielectric constants can be a function of the size, e.g., length and/or diameter, of the nanowire.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a photovoltaic device, the method comprising the steps of:

forming a plurality of silicon, germanium or silicon germanium nanowires on a substrate, wherein the plurality of nanowires attached to the substrate comprises a nanowire forest;

in the presence of a first doping agent and a first volatile precursor, depositing a first doped semiconductor layer over the nanowire forest that conforms to, and has the same relative shape as, the nanowire forest;

in the presence of a second doping agent and a second volatile precursor, depositing a second doped semiconductor layer on the first doped semiconductor layer that conforms to, and has the same relative shape as, the nanowire forest, wherein at least one of the first volatile precursor and the second volatile precursor comprises one or more of silane and germane, and wherein the first doping agent comprises one of an n-type doping agent and a p-type doping agent and the second doping agent comprises a different one of the n-type doping agent and the p-type doping agent from the first doping agent, such that a p-n junction is formed over the nanowire forest; and depositing a transparent electrode layer over at least a portion of the second doped semiconductor layer.

2. The method of claim 1, wherein the forming step further comprises the step of:

doping the substrate with an n-type doping agent.

3. The method of claim 1, wherein the forming step further comprises the steps of:

depositing at least one catalyst metal layer on the substrate;
annealing the substrate;
exposing the substrate to at least one nanowire volatile precursor; and
growing the plurality of nanowires.

4. The method of claim 3, wherein the at least one catalyst metal layer comprises one or more of gold, gallium and indium.

5. The method of claim 3, wherein the at least one nanowire volatile precursor comprises one or more of silane and germane.

6. The method of claim 3, wherein the substrate is annealed at a temperature of between about 400° C. and about 500° C.

7. The method of claim 1, wherein the n-type doping agent comprises phosphine and the p-type doping agent comprises diborane.

8. The method of claim 1, wherein one or more of the first doped layer, the second doped layer and the transparent electrode layer are deposited by chemical vapor deposition.

9. The method of claim 1, further comprising the step of:

roughening at least a portion of a surface of the substrate onto which the plurality of nanowires are formed.

10. A method of forming a photovoltaic device, the method comprising the steps of:

in the presence of a first doping agent and a first volatile precursor, forming a plurality of doped nanowires on a substrate to form a nanowire forest;

in the presence of a second doping agent and a second volatile precursor, depositing a doped semiconductor layer on the nanowire forest that conforms to, and has the same relative shape as, the nanowire forest; and depositing a transparent electrode layer over at least a portion of the doped semiconductor layer, wherein the first volatile precursor and the second volatile precursor each comprises germane wherein the first doping agent comprises one of an n-type doping agent and a p-type doping agent and the second doping agent comprises a different one of the n-type doping agent and the p-type doping agent from the first doping agent, such that a p-n junction is formed with the doped nanowires.

11. The method of claim 10, wherein the forming step further comprises the step of:

doping the substrate with an n-type doping agent.

12. The method of claim 10, wherein the forming step further comprises the steps of:

depositing at least one catalyst metal layer on the substrate;
annealing the substrate;
exposing the substrate to at least one nanowire volatile precursor; and
growing the plurality of nanowires.

13. The method of claim 12, wherein the at least one catalyst metal layer comprises one or more of gold, gallium and indium.

14. The method of claim 12, wherein the substrate is annealed at a temperature of between about 400° C. and about 500° C.

15. The method of claim 10, wherein the n-type doping agent comprises phosphine and the p-type doping agent comprises diborane.

16. The method of claim 10, wherein one or more of the doped semiconductor layer and the transparent electrode layer are deposited by chemical vapor deposition.

17. The method of claim 10, further comprising the step of:

roughening at least a portion of a surface of the substrate onto which the plurality of nanowires are formed.

* * * * *